United States Patent
Perner et al.

(10) Patent No.: US 6,188,615 B1
(45) Date of Patent: Feb. 13, 2001

(54) MRAM DEVICE INCLUDING DIGITAL SENSE AMPLIFIERS

(75) Inventors: Frederick A. Perner, Palo Alto, CA (US); Kenneth J. Eldredge, Boise, ID (US); Lung T. Tran, Saratoga, CA (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/430,611

(22) Filed: Oct. 29, 1999

(51) Int. Cl.$^7$ .................................................... G11C 16/04
(52) U.S. Cl. ...................... 365/189.01; 365/97; 365/100; 365/148; 365/158; 365/209; 365/225.5
(58) Field of Search ........................ 365/158, 97, 189.01, 365/100, 148, 209, 225.5

(56) References Cited

U.S. PATENT DOCUMENTS 5,761,115 * 6/1998 Kozicki et al. ....................... 365/100
5,793,697    8/1998 Scheuerlein .
5,838,608    11/1998 Zhu et al. .
6,061,289 * 6/1998 Itoh et al. ........................ 365/189.01

* cited by examiner

Primary Examiner—Richard Elms
Assistant Examiner—Van Thu Nguyen

(57) ABSTRACT

Resistance of a selected memory cell in a Magnetic Random Access Memory ("MRAM") device is sensed by a read circuit including a direct injection charge amplifier, an integrator capacitor and a digital sense amplifier. The direct injection charge amplifier supplies current to the integrator capacitor while maintaining an equipotential voltage on non-selected memory cells in the MRAM device. As the direct injection charge amplifier applies a fixed voltage to the selected memory cell, the sense amplifier measures integration time of a signal on the integrator. The signal integration time indicates whether the memory cell MRAM resistance is at a first state (R) or a second state (R+ΔR).

24 Claims, 10 Drawing Sheets

FIG. 8

MRAM DEVICE INCLUDING DIGITAL SENSE AMPLIFIERS

BACKGROUND OF THE INVENTION

The invention relates to random access memory for data storage, More specifically, the invention relates to a magnetic random access memory device including an array of memory cells and sense amplifiers for sensing resistance of the memory cells.

Magnetic Random Access Memory ("MRAM") is a non-volatile memory that is being considered for long term data storage. Performing read and write operations on MRAM devices would be orders of magnitude faster than performing read and write operations on conventional long term storage devices such as hard drives. In addition, the MRAM devices would be more compact and would consume less power than hard drives and other conventional long term storage devices.

A typical MRAM device includes an array of memory cells. Word lines extend along rows of the memory cells, and bit lines extend along columns of the memory cells. Each memory cell is located at a cross point of a word line and a bit line.

A memory cell stores a bit of information as an orientation of a magnetization. The magnetization of each memory cell assumes one of two stable orientations at any given time. These two stable orientations, parallel and anti-parallel, represent logic values of "0" and "1."

The magnetization orientation affects the resistance of a memory cell such as a spin-tunneling device. For instance, resistance of a memory cell is a first value R if the magnetization orientation is parallel, and resistance of the memory cell is increased to a second value R+ΔR if the magnetization orientation is changed from parallel to anti-parallel. The magnetization orientation of a selected memory cell and, therefore, the logic state of the memory cell may be read by sensing the resistance state of the memory cell.

The resistance state may be sensed by applying a voltage to a selected memory cell and measuring a sense current that flows through the memory cell. Ideally, the resistance would be proportional to the sense current.

However, sensing the resistance state of a single memory cell in the array can be unreliable. All memory cells in the array are coupled together through many parallel paths. The resistance seen at one cross point equals the resistance of the memory cell at that cross point in parallel with resistances of memory cells in the other rows and columns (the array of memory cells may be characterized as a cross point resistor network).

Moreover, if the memory cell being sensed has a different resistance due to the stored magnetization, a small differential voltage may develop. This small differential voltage can give rise to a parasitic or "sneak path" current. The parasitic current is typically much larger than the sense current and, therefore, can obscure the sense current. Consequently, the parasitic current can prevent the resistance from being sensed.

Unreliability in sensing the resistance state is compounded by manufacturing variations, variations in operating temperatures, and aging of the MRAM devices. These factors can cause the average value of resistance in the memory cell array to vary by a factor of two or three.

There is a need to reliably sense the resistance states of memory cells in MRAM devices.

SUMMARY OF THE INVENTION

This need is met by the present invention. According to one aspect of the present invention, a resistance state of a selected memory cell of an MRAM device is sensed by using the selected memory cell and a reference voltage to charge an integrator; measuring an amount of time for a voltage on the integrator to reach a reference voltage; and comparing the amount of time to a threshold. The selected memory cell is at a first resistance state if the amount of time is less than the threshold; and the selected memory cell is at a second resistance state if the amount of time is greater than the threshold.

Other aspects and advantages of the present invention will become apparent from the following detailed description, taken in conjunction with the accompanying drawings, illustrating by way of example the principles of the invention.

DETAILED DESCRIPTION OF THE INVENTION

As shown in the drawings for purposes of illustration, the present invention is embodied in a Magnetic Random Access Memory device. The MRAM device includes an array of memory cells and a read circuit for reading data from the memory cells. The read circuit, which includes direct injection charge amplifiers, integrator capacitors and digital sense amplifiers, can reliably sense different resistance states of selected memory cells in the array.

Figure 1:
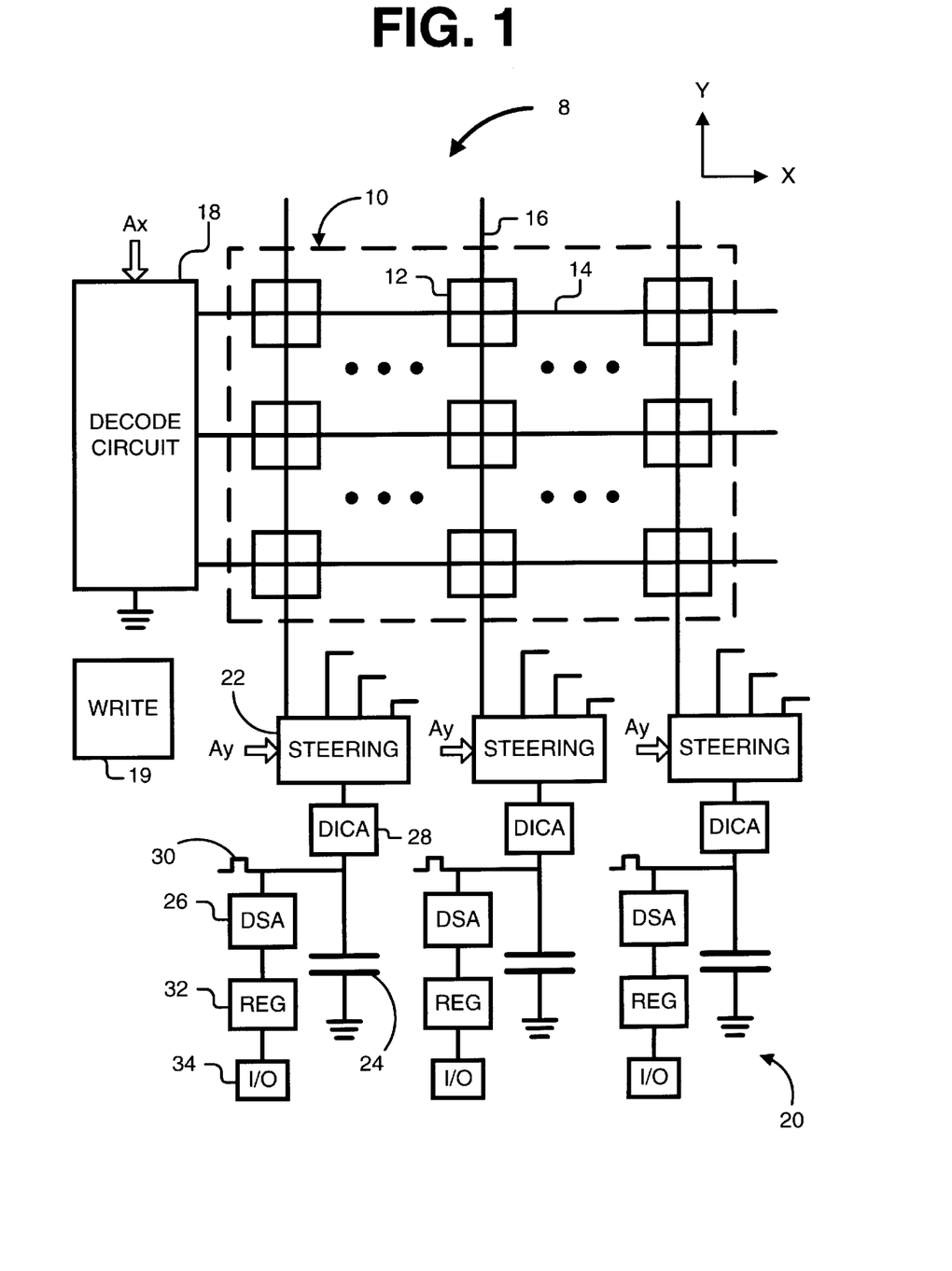
FIG. 1 is an illustration of an MRAM device including an array of memory cells and a read circuit.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of 1024× 1024 memory cells or larger may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a crossing point of a corresponding word line 14 and bit line 16.

The memory cells 12 are not limited to any particular type of device. For example the memory cells 12 may be spin dependent tunneling ("SDT") devices. A typical SDT device includes a "pinned" layer and a "free" layer. The pinned layer has a magnetization that is oriented in a plane, but fixed so as not to rotate in the presence of an applied magnetic field in a range of interest. The free layer has a magnetization orientation that is not pinned. Rather, the magnetization can be oriented in either of two directions along an axis (the "easy" axis) lying in a plane. If the magnetization of the free and pinned layers 50 and 52 are in the same direction, the orientation is said to be "parallel" (as indicated by the arrows in FIG. 2a). If the magnetization of the free and pinned 50 and 52 layers are in opposite directions, the orientation is said to be "anti-parallel" (as indicated by the arrows in FIG. 2b).

Figure 2A:
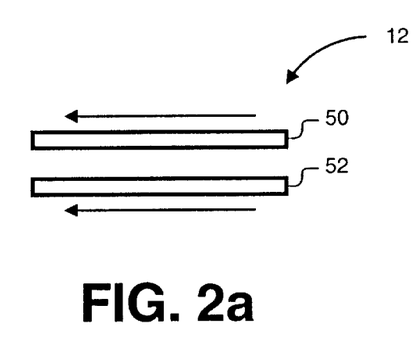
FIGS. 2a and 2b are illustrations of parallel and anti-parallel magnetization orientations of a memory cell.
Figure 2B:
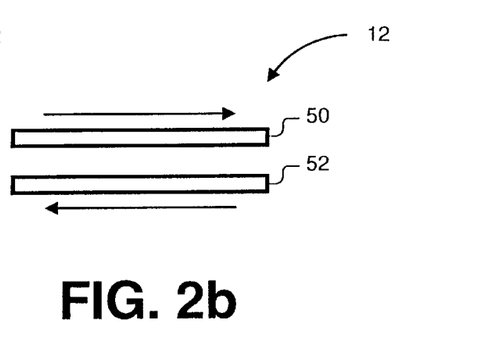

The free layer and the pinned layer are separated by an insulating tunnel barrier. The insulating tunnel barrier allows quantum mechanical tunneling to occur between the free and pinned layers. This tunneling phenomenon is electron spin dependent, making the resistance of the SDT device a function of the relative orientations of the magnetization of the free and pinned layers.

For instance, resistance of a memory cell 12 is a first value R if the orientation of magnetization of the free and pinned layers is parallel. Resistance of the memory cell 12 is increased to a second value R+ΔR if the magnetization orientation is changed from parallel to anti-parallel. A typical resistance R may be about 1 megaohms. A typical change in resistance ΔR may about 10% of the resistance R.

Data is stored in a memory cell 12 by orienting the magnetization along the easy axis of the free layer. A logic value of "0" may be stored in the memory cell 12 by orienting the magnetization of the free layer such that the magnetization orientation is parallel, and a logic value of "1" may be stored in the memory cell 12 by orienting the magnetization of the free layer such that the magnetization orientation is anti-parallel.

Each memory cell 12 retains its orientation of magnetization, even in the absence of external power. Therefore, the memory cells 12 are non-volatile.

The MRAM device 8 also includes a row decoder 18 for selecting word lines 14 during read and write operations. A word line 14 may be selected during a read operation by connecting that word line 14 to ground The MRAM device 8 also includes a read circuit for sensing the resistance of selected memory cells 12 during read operations and a write circuit 19 for orienting the magnetization of the selected memory cells 12 during write operations, The read circuit is indicated generally at 20. The write circuit 19 is not shown in detail in order to simplify the explanation of the present invention.

The read circuit 20 includes a plurality of steering circuits 22, integrator capacitors 24, digital sense amplifiers 26, direct injection charge amplifiers 28 and reset switches 30. A memory cell 12 is selected by supplying a row address Ax to the row decoder 18 and a column address Ay to the steering circuits 22. In response to the row address Ax, the row decoder 18 couples a word line 14 to ground. In response to the column address Ay, a steering circuit 22 couples a bit line 16 to a charge amplifier 28. A selected memory cell 12 lies at the cross point of selected word and bit lines 14 and 16.

For a selected column of memory cells, the direct injection charge amplifier 28 supplies a current to its integrator capacitor 24 while maintaining a potential on the non-selected memory cells 12 of the selected bit line 16. This potential is equal to the potential applied to non-selected rows and columns of the MRAM array 10. As the charge amplifier 28 applies a fixed voltage to the selected bit line 16, a resulting constant sense current is supplied to the integrator capacitor 24. The digital sense amplifier 26 measures signal integration time. The signal integration time is partly a function of the resistance of the selected memory cell 12, which is either at a first state R or a second state R+ΔR. The digital sense amplifier 26 can determine the resistance state of the memory cell 12 and, therefore, the logic value stored in the memory cell 12 by comparing the signal integration time to a threshold. An output of the digital sense amplifier 26 is supplied to an output register 32 which, in turn, is coupled to an I/O pad 34 of the MRAM device 8.

The read circuit 20 may read out data in m-bit words, whereby the resistance states of a number m of memory cells 12 are sensed simultaneously. For example, a first group of k contiguous bit lines 16 might be multiplexed into a first charge amplifier 28, a second group of k contiguous bit lines 16 might be multiplexed into a second charge amplifier 28, and so on. An m-bit word might be read out by operating m consecutive sense/charge amplifiers 26/28 simultaneously.

If a single digital sense amplifier 26 can fit a pitch of sixty four columns and data is stored as 16-bit words, sixteen sense amplifiers 26 could be used for a 1024×1024 array 10 of memory cells 12. A total of k=64 bit lines 16 would be multiplexed into each charge amplifier 28. If the MRAM device 8 has multiple levels of memory cell arrays (see, for example, FIG. 7), bit lines 16 from the additional levels would be multiplexed into the charge amplifiers 28.

Each steering circuit 22 includes a set of switches that connect each bit line 16 to either a constant voltage source or a charge amplifier 28. Each steering circuit 22 further includes a column decoder. The column decoder selects only one switch for connecting the selected bit line 314 to the charge amplifier 28. All other (unselected) bit lines 314 are be connected to the constant voltage source. The constant voltage source may be supplied from an external circuit.

Figure 3:
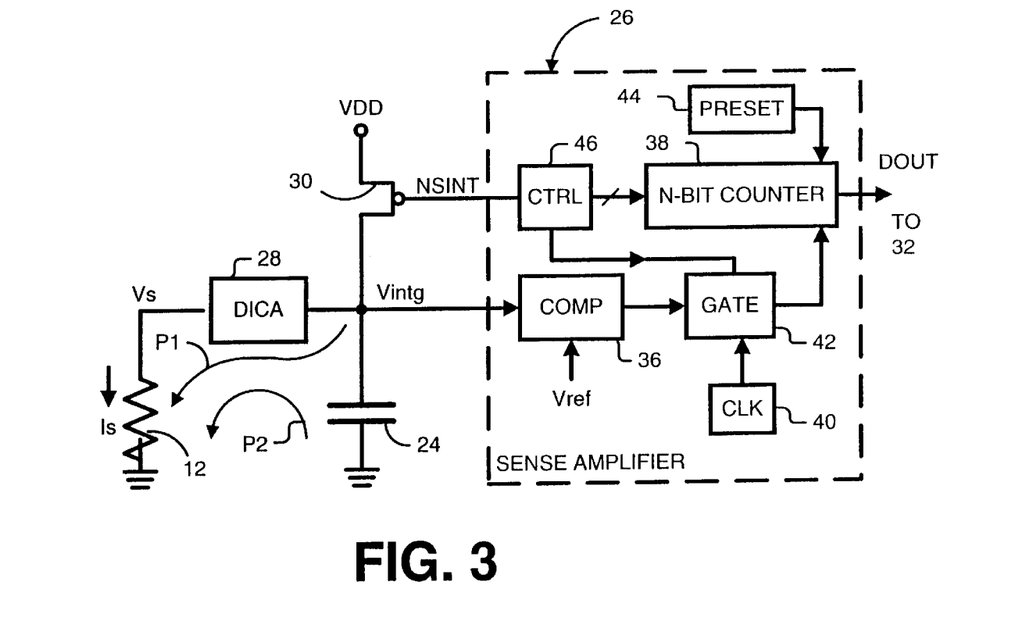
FIG. 3 is an illustration of a digital sense amplifier, which forms a part of the read circuit.

Reference is now made to FIG. 3, which illustrates the digital sense amplifier 26 during a read operation of a selected memory cell 12. The selected memory cell 12 is represented by a resistor.

The reset switch 30 may be a PMOS transistor. An external control signal NSINT controls whether the reset switch 30 is on (conducting) or off (not conducting). When the reset switch 30 is on, a supply voltage VDD is applied to the integrator capacitor 24 and the selected memory cell 12 through the direct injection charge amplifier 28. Thus, the integrator capacitor 24 is charged as a first signal follows a first path P1, which goes through the reset switch 30 and the selected memory cell 12. When the reset switch 30 is off, the sense current (Is) flowing through the selected memory cell 12 is supplied to the integrator capacitor 24. A second (sense) signal follows a second path P2, which goes through the integrator capacitor 24 and the selected memory cell 12. The second signal includes current from the selected memory cell 12 and parasitic currents in the MRAM array 10. The parasitic currents in the MRAM array 10 can arise due to the voltage across the unselected MRAM memory cells 12 not being precisely equal to the applied array voltage.

As long as the integrator voltage is greater than the voltage across the selected memory cell 12, the capacitor 24 functions as a linear integrator.

The direct injection charge amplifier 28 controls a sense voltage Vs across the memory cells 12 independent of the second (sense) current. When a constant voltage is applied to all memory cells 12 (that is an equipotential across the memory cells), variations in resistance will not cause a current variation across the remaining parallel memory elements 12 and, thus, the parasitic sense current can be made substantially less than the sense current. The current that flows in the direct injection charge amplifier 28 is then directly proportional to the resistance of the selected memory cell 12 without having to make corrections or adjustments for variations in the sense voltage Vs.

A direct injection charge amplifier 28 that can minimize the voltage difference across the memory cells 12 is disclosed in U.S. Ser. No. 09/430,238 filed. Oct. 29, 1999. The direct injection charge amplifier 28 includes a high gain negative feedback amplifier for controlling the selected bit line voltage (that is, the sense voltage Vs) to a set value and minimizing the variance of the sense voltage Vs over a wide range of sense currents.

The resistance of the memory cell 12 and the capacitance of the integrator capacitor 24 determine how fast the integrator capacitor 24 is discharged after the reset switch 30 is opened. All other parameters being equal, the integrator capacitor 24 will discharge faster when the memory cell 12 has a resistance of R (logic '0') than when the memory cell 12 has a resistance of R+ΔR (logic '1').

The sense amplifier 26 measures the integration time to determine the resistance state of the selected memory cell 12 and, therefore, the logic value stored in the selected memory cell 12. The sense amplifier 26 includes a comparator 36 for comparing capacitor voltage Vintg to a DC reference voltage Vref. The sense amplifier 26 further includes an N-bit counter 38, a high frequency clock 40 and a gate 42. The gate 42 is used to start and stop the clock 40, and the clock 40 causes the counter 38 to increment a counter value at clock frequency. If the clock 40 is-started when the reset switch 30 is turned off, and the clock 40 is stopped when the capacitor voltage Vintg equals the reference voltage Vref, the counter value stored in the counter 38 will indicate the amount of time for voltage on the integrator capacitor 24 to decay to the reference voltage Vref.

Reading a memory cell 12 without resetting the counter 38 to a zero counter value will produce a cumulative time measurement and will hereinafter be referred to as a "cumulative read."

Before a read operation is performed, the negative of a threshold is preloaded into the counter 38. After a cumulative read, the most significant bit of the counter value represents the logic value stored in the selected memory cell 12. An output DOUT of the most significant of the counter 38 is coupled to the register 32.

For example, basic circuit parameters may be sized to accommodate a sense current range of 200 nA to 500 nA, a power supply voltage VDD of 3.3V, a reference voltage Vref of 1.0 volts, a clock 40 having a clock frequency of 100MHz, and a counter 38 that is 9-bits wide.

The minimum DC sense current of 200 nA dictates the capacitance C of the integrator capacitor 24 for a 2.3V swing (VDD−Vref) in 512 levels, with each clock tick equaling 10 nanoseconds.

A sense current Is of 400 nA represents a reference logic '1' and a sense current (Is) of 350 nA represents a reference logic '0'. The current sense process translates the sense current (Is) to a counter value CNT that is dependent upon the frequency of the clock 40, the voltage swing (VDD−Vref), and the capacitance of the integrator capacitor 24:

$$CNT=bin(C*(VDD-Vref)*100/Is).$$

A reference logic '1' translates to 255 counter ticks (i.e., 0,111,111,111) and a reference logic '0' translates to 292 counter ticks (i.e., 0,100,100,100)

The sense amplifier 26 further includes an N-bit preset register 44, which can temporarily store the contents of the counter 38 and which can load its contents into the counter 38. The preset register 44 can also be loaded with specific values (e.g., 0 for initialization; −1 for 2's complement addition). Those specific values can be supplied from I/O pads of the MRAM device 8.

A controller 46 is provided to control the reset switch 30, counter 38, gate 42 and preset register 44. Under control of the controller 46, the digital sense amplifier 26 can operate under different modes. The different modes are selected by supplying a signal to I/O pads of the MRAM device 8.

Figure 4A:
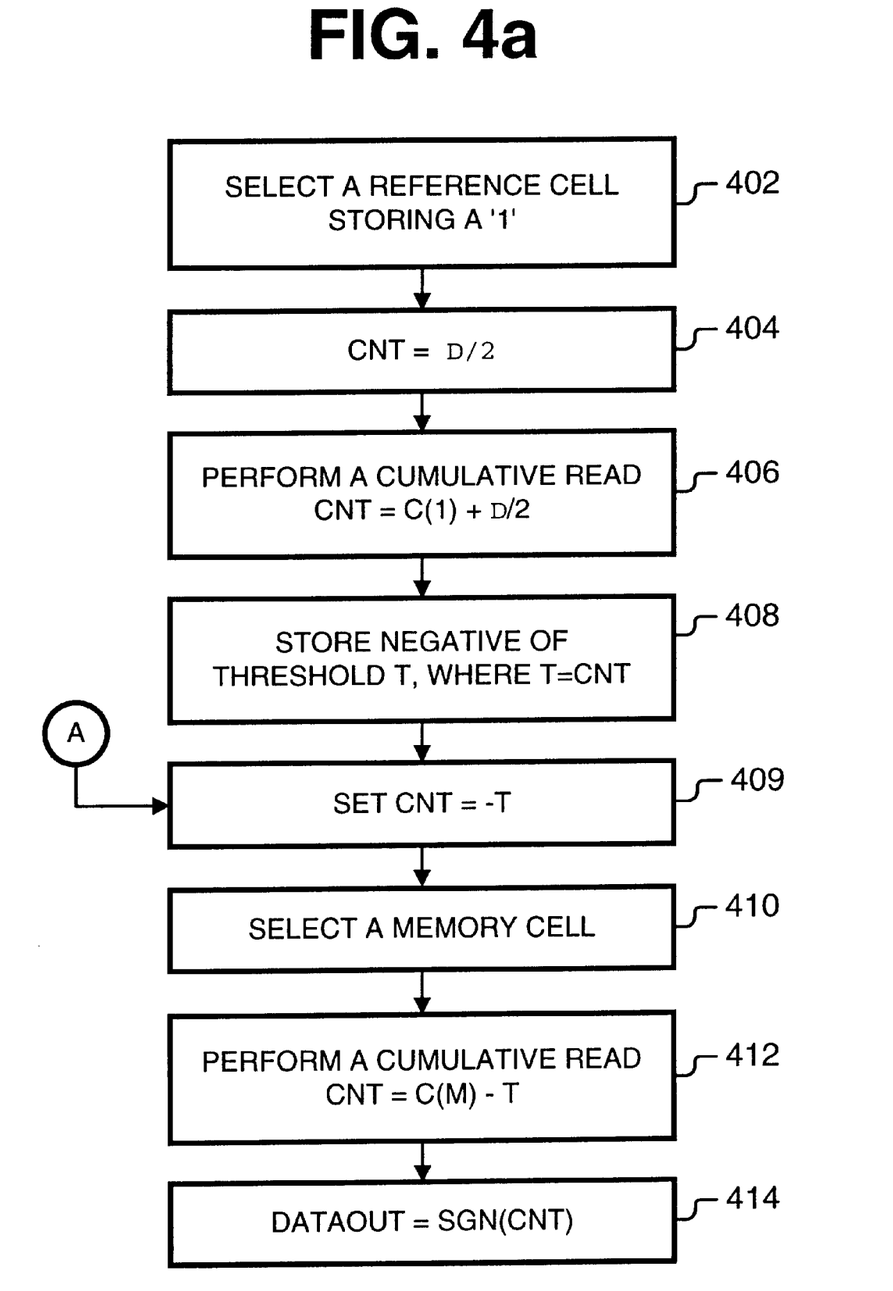
FIGS. 4a to 4e are flowcharts of different modes of operation of the digital sense amplifier.

Reference is now made to FIGS. 4a to 4e, which illustrate five different modes of operation of the digital sense amplifier 26. FIG. 4a shows the first mode, in which a one-sample non-destructive read is performed. A reference cell is selected by selecting its corresponding plane, row and column addresses (block 402). The reference cell may be any memory cell 12 having a known logic value. In the alternative, the reference cell may be selected from a dedicated row of memory cells 12 in the array 10, that is, a reference cell row. Reference 1's and 0's would be written to the reference cells in the reference cell row.

An estimated time difference D/2 (in clock ticks) between a logic '0' and a logic '1' is then loaded into the counter 38 (block 404). A cumulative read of the reference cell is then performed (block 406). The counter 38 increments the counter value CNT at the clock frequency until Vintg=Vref Thus, the counter value CNT in the counter is increased by the measured amount of time C(1), whereby CNT=C(1)+D/2.

Following step 406, a negative of a threshold T is stored in the preset register (block 408). The threshold T is equal to the counter value CNT, that is, T=CNT. The 2's complement of the counter value CNT is stored in the preset register 44. The contents of the preset register 44 are then loaded into the counter 38 (block 409). Thus, the counter value CNT is set equal to the negative of the threshold T, that is CNT=−T.

After the threshold T has been stored, the logic states of selected memory cells 12 are sensed. A memory cell 12 is selected by selecting its corresponding plane, row and column addresses (block 410).

A cumulative read of the selected memory cell 12 is then performed (block 412). The counter 38 increments the counter value CNT at the clock frequency until Vintg=Vref Thus, the counter value CNT is increased by the measured amount of time C(M), whereby CNT=C(M)−T.

The sign of the counter value CNT indicates the logic value of the selected memory cell 12 (block 414). If the selected memory cell 12 caused the integrator capacitor 24 to discharge quickly such that C(M)<T (because of a lower memory cell resistance R), the value of the counter 38 is negative, whereby the most significant bit is a '1' (in 2's complement). Conversely, if the selected memory cell 12 caused the integrator capacitor 24 to discharge slowly such that C(M)>T (because of a higher memory cell resistance R+ΔR), the value of the counter 38 is positive, whereby the most significant bit is a '0'.

After the threshold T has been determined, steps 402 to 408 do not have to be repeated for reads of additional memory cells 12. An additional memory cell 12 may be read by loading the negative value of the threshold T from the preset register 44 into the counter 38 (block 409 via entry point A), selecting the additional memory cell 12 (block 410), performing a cumulative read (block 412), and examining the sign of the counter value CNT (block 414).

A new threshold T may be determined whenever the MRAM device 8 is calibrated. Calibration may occur during computer boot-up or following detection of major system changes such as significant changes in ambient temperature, power supply voltages, and detected error rate.

The following example of a read operation uses the parameters described above and assumes that reading the reference cell storing a '1' results in a counter value of 255. At the beginning of the read operation, the value INT[(292−255)/2]=18 is loaded into the counter 38 to represent the estimated discharge time difference D/2 between reads of a logic value '0' and a logic value '1' (block 404). A cumulative read of the reference cell storing the logic value '1' is performed (block 406), whereby the counter value CNT is increased by 255. Thus the counter value CNT=273. The 2's complement of the counter value CNT is stored in the preset register 44 (block 408) and the contents of the preset register 44 are stored in the counter 38, whereby CNT=−273 (block 409). A memory cell 12 is selected (block 410), and a cumulative read of the selected memory cell 12 increases the counter value CNT by 290 (block 412). At the end of the second cumulative read, the counter value CNT is positive (CNT=17), whereby the most significant bit of the counter 38 indicates that a logic value of '0' is stored in the selected memory cell 12 (block 414).

Figure 4B:
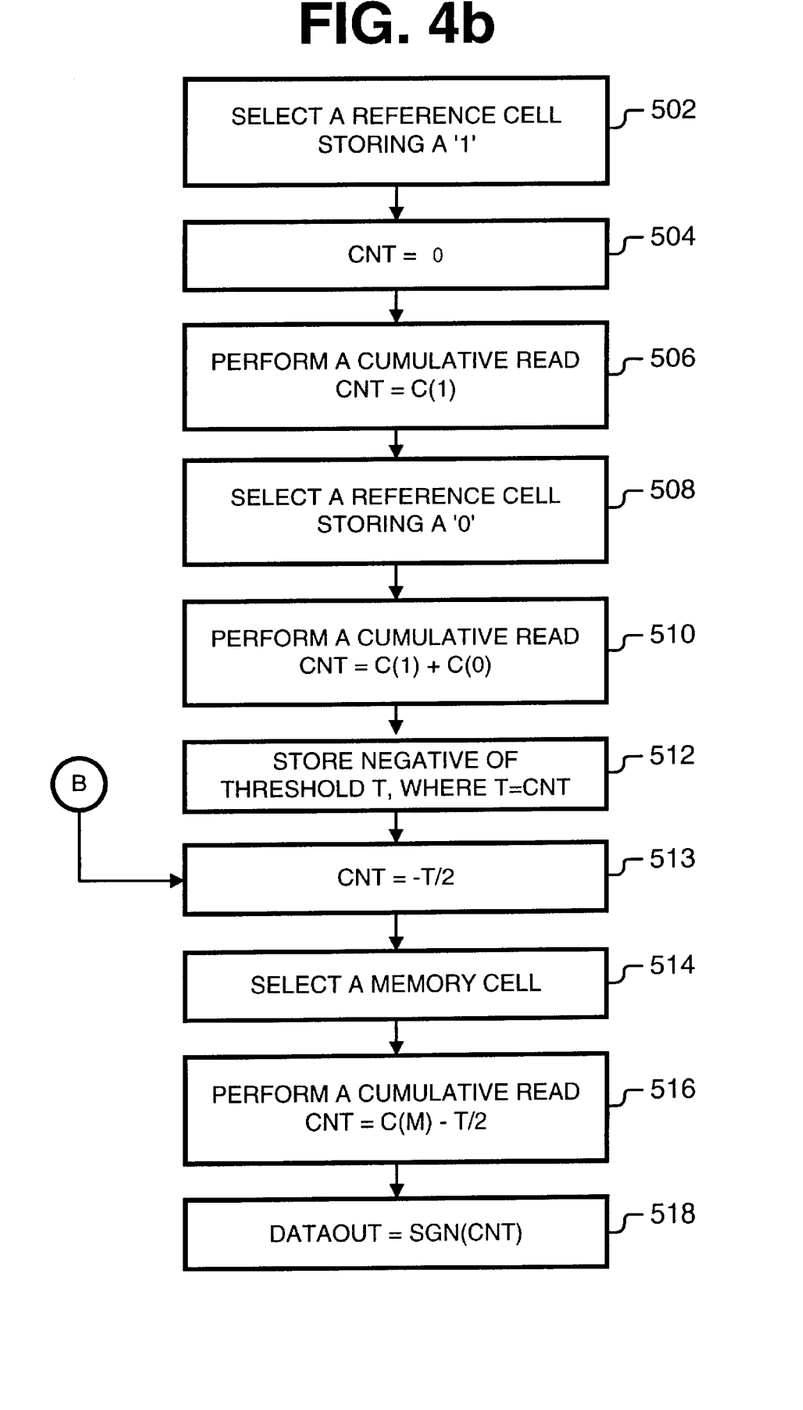

FIG. 4b shows the second mode of operation, in which a two-sample non-destructive read is performed. The second mode is similar to the first mode, except that the discharge time difference between reads of logic values '1' and a '0' is measured instead of estimated.

A reference cell storing a '1' is selected by selecting its corresponding plane, row and column addresses (block 502), and the counter value CNT is initialized to CNT=0 (block 504). A cumulative read of the memory cell 12 storing the '1' is then performed (block 506). The counter value CNT is increased by the measured count C(1), that is CNT=C(1).

A reference cell storing a '0' is selected by selecting its corresponding plane, row and column addresses (block 508), and a cumulative read of the memory cell 12 storing the '0' is performed (block 510). The counter value CNT is increased by the measured count C(0). Thus, the counter value CNT at the end of the second cumulative read is CNT=C(0)+C(1).

The negative value of the threshold T is then stored in the preset register 44 (block 512). The contents of the preset register 44 are shifted right by one bit and loaded into the counter 38 (block 513). The shift of one counter bit performs a "divide-by-2" arithmetic operation on the value stored in the preset register 44 as it loads the stored data into the counter 38. Thus, the counter value is set to CNT=−T/2.

A memory cell 12 is selected (block 514) and read (block 516), and the sign of the counter value CNT is examined to determine whether the memory cell 12 stores a logic value of '0' or '1' (block 518). Each additional memory cell 12 may be read by loading value −T/2 into the counter 38 (block 513 via entry point B) and then performing steps 514 to 518.

The read operations illustrated in FIGS. 4a and 4b are non-destructive in that the magnetization polarization of the memory cells 12 being read are not changed. However, the thresholds for the memory cells 12 being read are not measured directly; instead, the thresholds are estimated or inferred from the measurements of the reference cells.

Destructive read operations, in contrast, change the magnetization polarization in order to directly measure the thresholds for the memory cells 12 being read. The destructive read operations all involve sensing the stored value of a selected memory cell 12 and then writing and reading at least one known logic value from the selected memory cell 12.

Figure 4C:
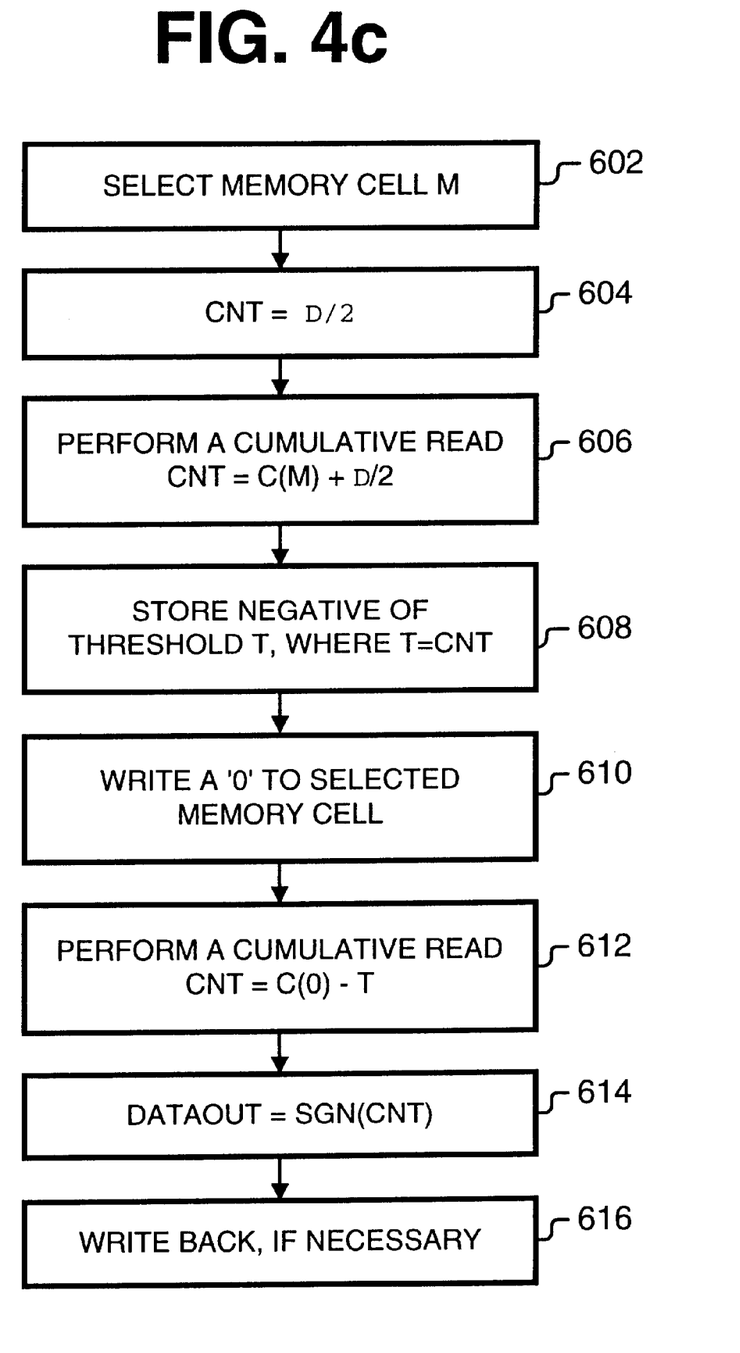

FIG. 4c shows the third mode of operation, in which a two-sample destructive read is performed. A memory cell 12 is selected (block 602) and an estimated discharge time difference D/2 is loaded into the counter 38 (block 604). A cumulative read of the selected memory cell 12 is then performed (block 606), whereby the counter value becomes CNT=C(M)+D/2. The 2's complement of the counter value CNT is stored in the preset register 44 and the counter 38, whereby the negative value of the threshold T is stored (block 608).

Once the negative value of the threshold T has been stored, the logic value of the selected memory cell 12 is determined. A logic value of '0' is written to the selected memory cell 12 (block 610) and a cumulative read of the selected memory cell 12 is performed (block 612), whereby the counter value becomes CNT=C(0)−T or CNT=C(0)−C(M)−D/2. Thus, the measured discharge time of the integrator capacitor 24 is compared to the threshold T.

The sign of the counter value CNT is then examined to determine whether the stored value is a '1' or a '0' (block 614). After this destructive read has been performed, the value of the selected memory cell 12 is restored (block 616). If the logic value that was read is a '1', then a '1' is written back to the selected memory cell 12. If the logic value that was read is a '0', then a write back is not performed since the logic value of '0' was last written to the selected memory cell 12.

Figure 4D:
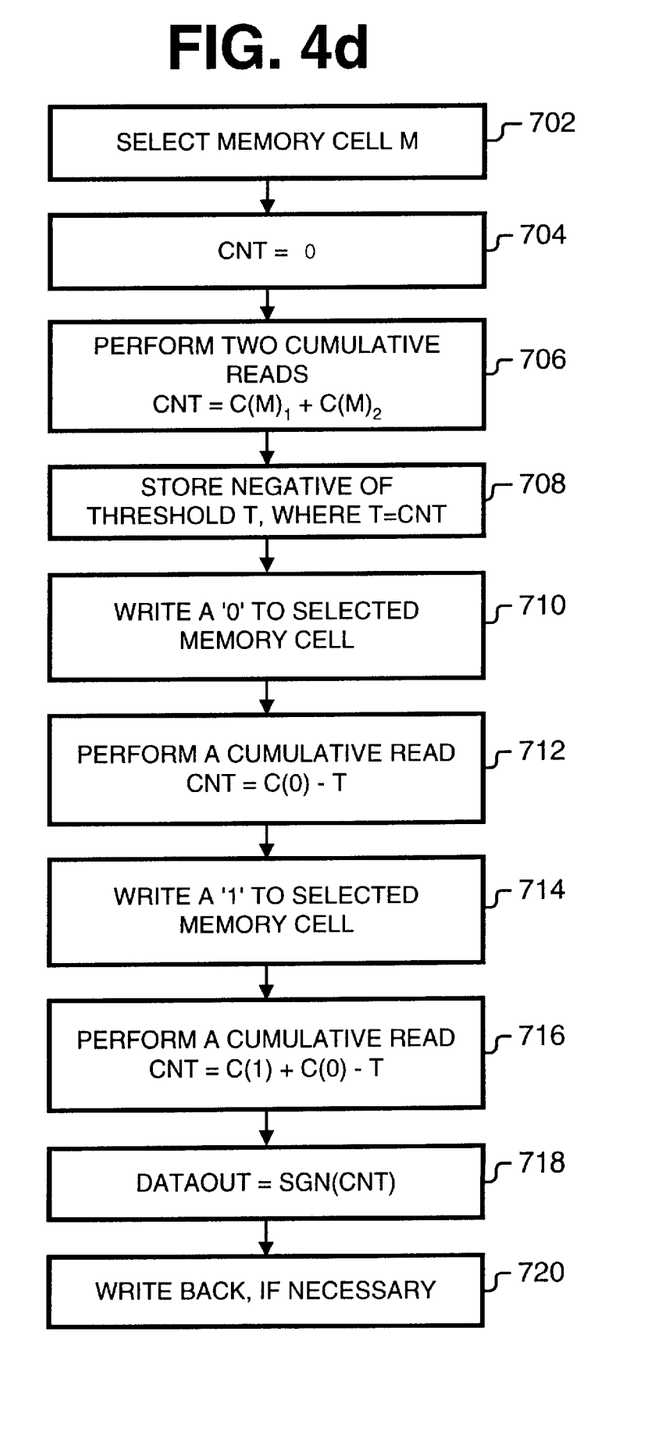

FIG. 4d shows the fourth mode of operation, in which a three-sample destructive read is performed. The fourth mode is performed in essentially the same manner as the third mode, except that the stored value of the selected memory cell 12 is read twice, and the discharge time difference between a stored '1' and a stored '0' is measured instead of estimated.

A memory cell 12 is selected (block 702), the counter 38 is initialized to CNT=0 (block 704) and two cumulative reads of the selected memory cell 12 are performed (block 706), whereby the count CNT becomes CNT=C(M)$_1$+C(M)$_2$. The 2's complement of the count CNT is stored in the preset register 44 and the counter 38, whereby the negative value of the threshold T is stored (block 708).

A logic value of '0' is written to the selected memory cell 12 (block 710) and a cumulative read of the selected memory cell 12 is performed (block 712), whereby the count CNT becomes CNT=C(0)−T. A logic value of '1' is then written to the selected memory cell 12 (block 714) and another cumulative read is performed (block 716), whereby the counter value becomes CNT=C(1)+C(0)−T=C(1)+C(0)−C(M)$_1$−C(M)$_2$.

The sign of the counter value CNT is then examined to determine whether the logic value of the selected memory cell was a '1' or a '0' (block 718). After the destructive read has been performed, the value of the selected memory cell 12 is restored, if necessary (block 720).

Figure 4E:
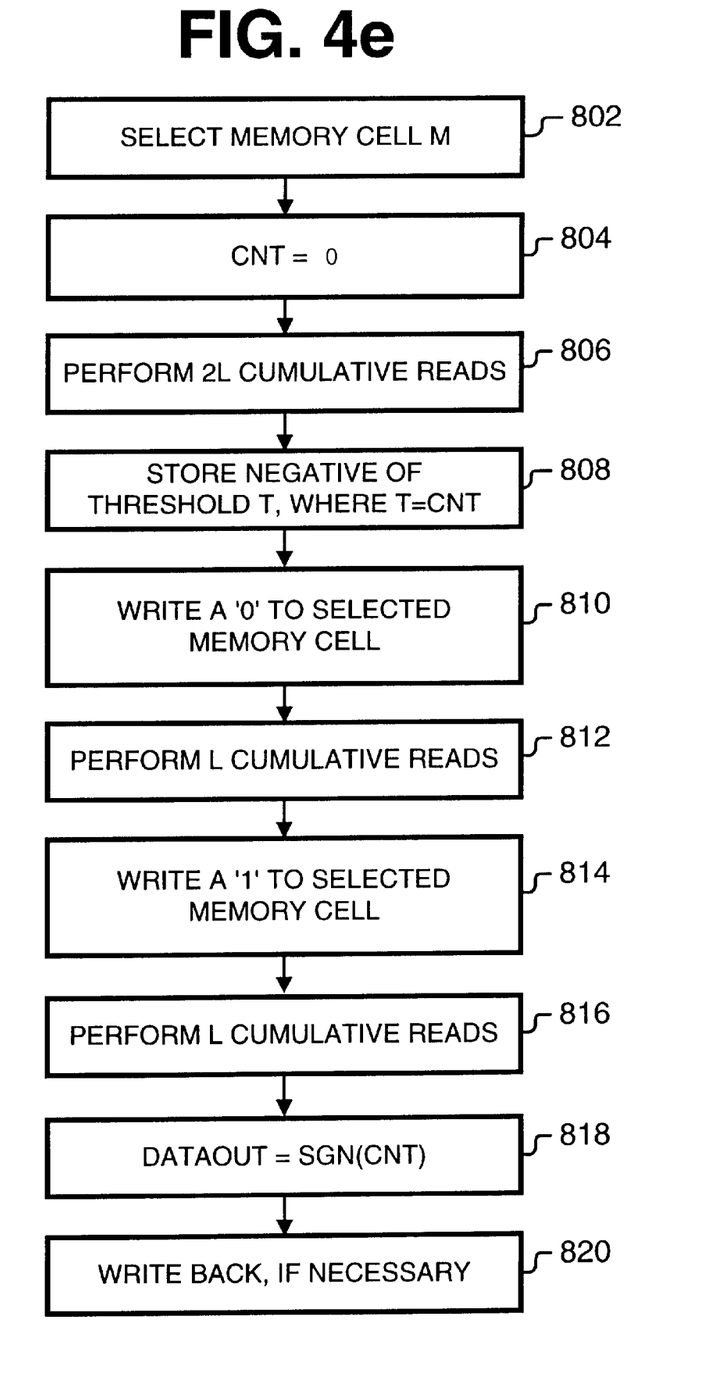

FIG. 4e shows the fifth mode of operation, in which a 2L-average destructive read is performed. The fifth mode differs from the fourth mode in that 2L reads of the memory cell 12 are performed (block 806) after the count CNT has been initialized (block 804), L cumulative reads are performed (block 812) after a '0' has been written to the selected memory cell (block 810); and L cumulative reads are performed (block 816) after a '1' has been written to the selected memory cell (block 814), where L>1.

If L=2, for example, a 4-average destructive read may be performed by selecting a memory cell 12 (block 802), initializing the counter value CNT to zero (block 804), performing four cumulative reads of the selected memory cell 12 (block 806), storing the 2's complement of the counter value CNT as the negative of the threshold T (block 808), writing a logic value of '0' to the selected memory 12 (block 810), performing two cumulative reads (block 812), writing a logic value of '1' to the selected memory cell 12 (block 814) and performing two more cumulative reads (block 816).

The sign of the counter value CNT is then examined to determine whether a logic value of '1' or a '0' was stored in the memory cell 12 (block 818). After the destructive read has been performed, the value of the selected memory cell 12 is restored, if necessary (block 820).

Each mode of operation offers different advantages. The nondestructive read modes are fastest to perform because write operations are not performed. Measuring the reference logic values can be more accurate than estimating the logic values but more time consuming. Performing multiple reads offer the slowest read time but the highest reliability. Multiple reads are performed to average sampling noise over many read operations. Given a condition where the count difference is small, increasing the number of samples will average out sample noise.

Figure 5:
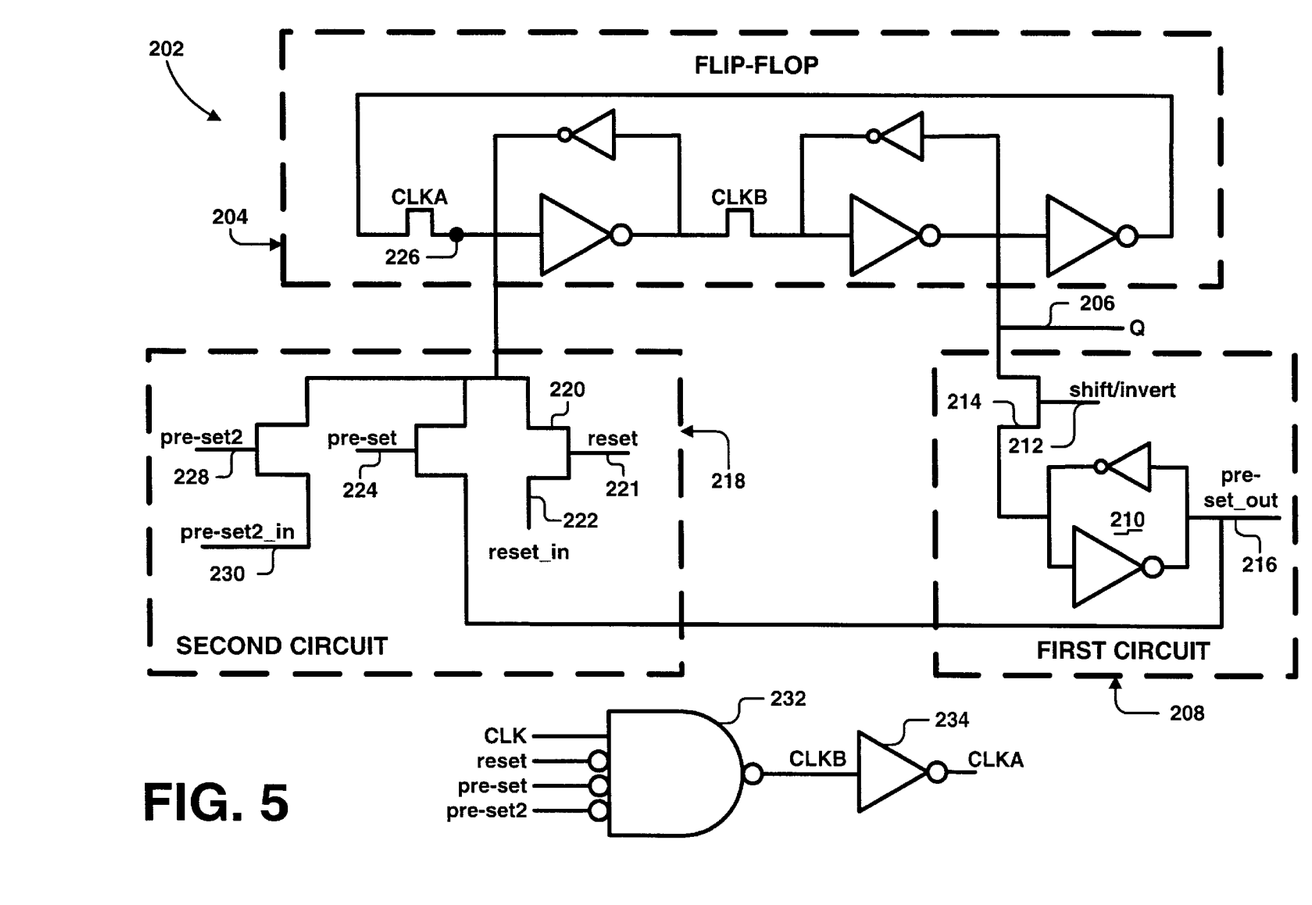
FIG. 5 is an illustration of a bit of a presettable counter for the digital sense amplifier.
Figure 6:
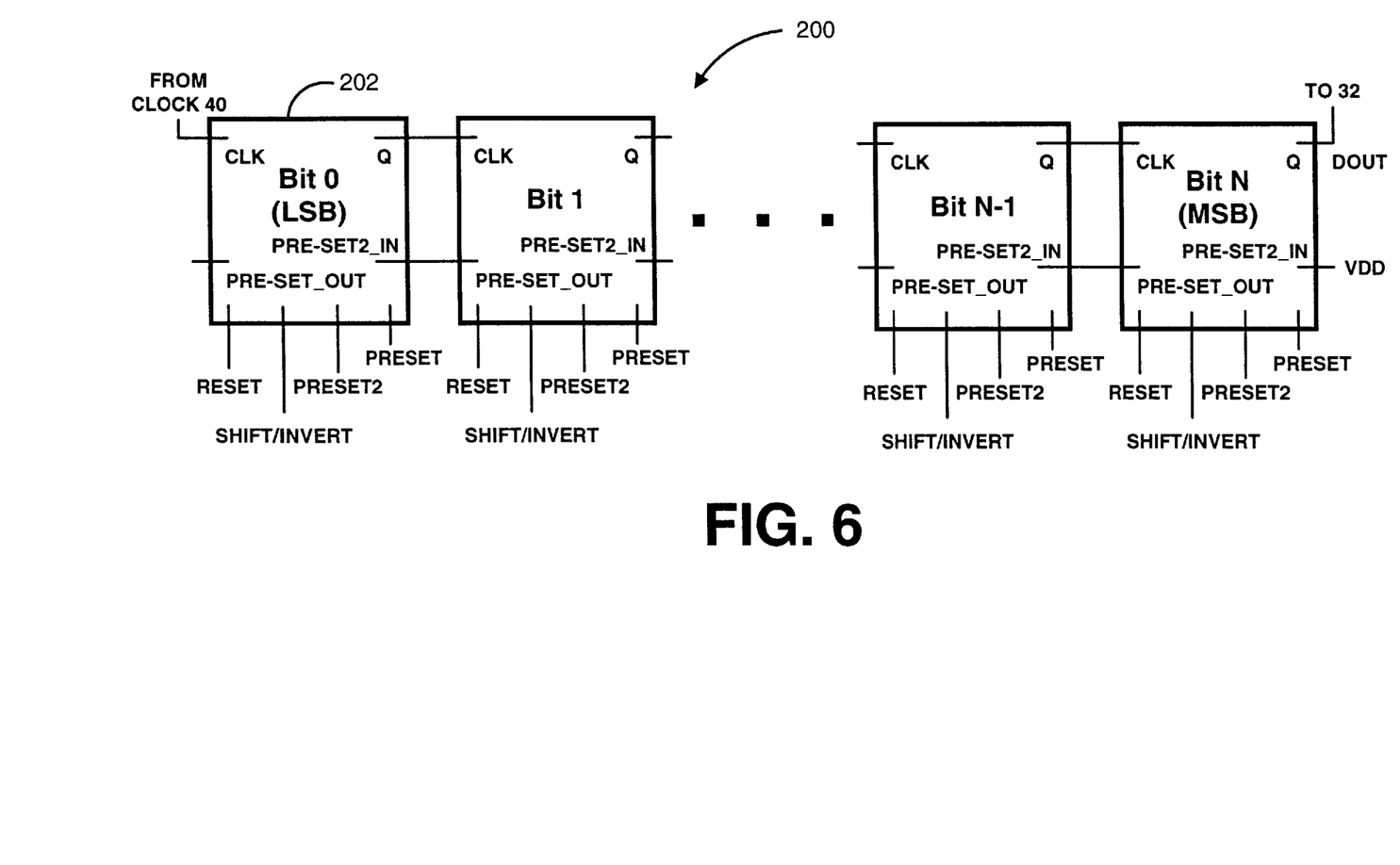
FIG. 6 is an illustration of the presettable counter.

FIGS. 5 and 6 show an embodiment of an N-bit presettable counter 200, which combines the functions of the counter 38 and the preset register 44. FIG. 5 shows a register 202 of the presettable register 200. The register 202 includes a T-type flip-flop 204 for a storing a bit of the counter value. The flip-flop 204 has a clock input CLK and a Q-output 206. A transition of the clock input CLK from '0' to '1' at the input of the flip-flop 204 causes the content of the flip-flop 204 to toggle from a '1' to a '0' or from a '0' to a '1'. The flip-flop content is not toggled if the clock input CLK transitions from a '1' to a The register 202 includes a first circuit 208. The first circuit 208 includes a latch 210, which corresponds to a bit of the preset register 44. A bit of the counter value is transferred from the flip-flop 204 to the latch 210 by sending a pulse to a shift/invert input 212 (that is, a gate) of a transistor 214. The latch 210 has a pre-set_out output 216. The pre-set_out output 216 provides a complement of the Q output 206.

The register 202 also includes a second circuit 218 for resetting the flipflop 204 or setting the flip-flop 204 to a pre-set value. The flip-flop 204 can be reset to either a '0' or a '1' or an externally-supplied value by supplying a pulse to a reset input 221. The value to which the flip-flop 204 is reset depends upon whether a reset transistor 220 is pulled to ground GND, the supply voltage VDD, or to a value supplied by an external circuit to a reset_in input 222.

The flip-flop 204 can be set to a first pre-set value by sending a pulse to a first pre-set input 224, thereby coupling the pre-set_out output 216 to an internal node 226. The flip-flop 204 can be set to a second pre-set value by sending a pulse to a second pre-set input 228 and applying a value on a preset2_in input 230 to the internal node 226.

A NAND gate 232 and an inverter 234 provide clocks CLKA and CLKB for the flip-flop 204.

Referring now to FIG. 6, a total of N registers 202 are ganged together to form the N-bit presettable counter 200. The clock input CLK of the least significant bit LSB receives the pulses from the clock 40. The Q output of each register 202 is coupled to the clock input CLK of the next register, except for the most significant MSB, whose Q output provides the counter value sign DOUT. If the counter 38 is reset to 0, a first pulse at the clock input of the LSB will generate a counter value of CNT=00 . . . $01_2$; a second pulse at the clock input of the LSB will generate a counter value of CNT=00 . . . $10_2$; a third pulse at the clock input of the LSB will generate a counter value of CNT=00 . . . $11_2$; and so on.

Applying a pulse to the reset input 221 of the registers 202 causes the counter value CNT to be reset to a digital word that is applied to the I/O pads of the MRAM device 8. This allows the counter value CNT to be set to values such as −1 (11 . . . $11_2$), D/2, etc. This also allows the counter 38 to be adjusted for tuned for anticipated integrator offsets.

The pre-set2_in input 230 of the MSB is tied to the supply voltage VDD. The pre-set_out output 216 of each register 202 is tied to the pre-set2_in input 230 of the next lower register, except for the least significant bit LSB. The pre-set_out output 216 of the LSB is left open.

Applying a pulse to the shift/invert and first pre-set inputs 212 and 224 of each register 202 will cause the counter contents to be inverted. Applying a pulse to the shift/invert and second pre-set inputs 212 and 228 of each register 202 will cause the counter contents to be inverted and shifted left by one bit.

Figure 7:
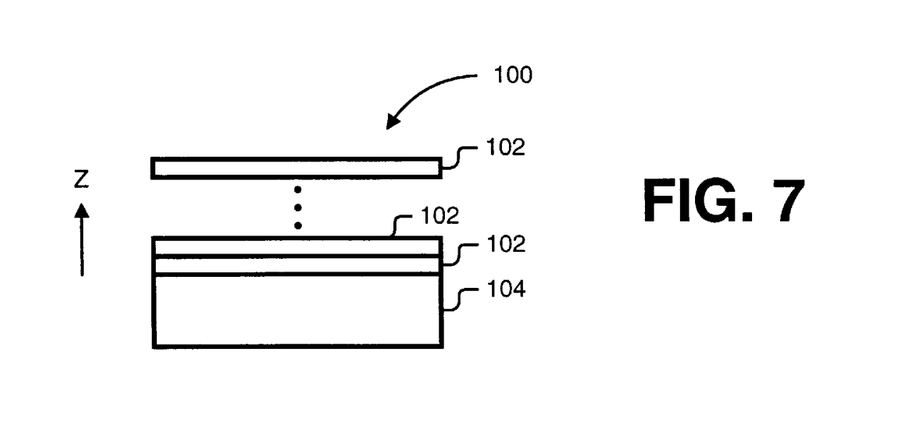
FIG. 7 is an illustration of an MRAM chip including multiple levels.

Reference is now made to FIG. 7, which illustrates a multi-level MRAM chip 100. The MRAM chip 100 includes a number Z of memory cell levels or planes 102 that are stacked in a z-direction on a substrate 104. The number Z is a positive integer where Z≧1. The memory cell levels 102 may be separated by insulating material (not shown) such as silicon dioxide. Read and write circuits may be fabricated on the substrate 104. The read and write circuits may include additional multiplexers for selecting the levels that are read from and written to.

Thus disclosed is an MRAM device including a circuit that can read data reliably. The read circuit reduces parasitic currents such that the sense currents are not obscured during read operations. In addition, sensitivity of the MRAM device to aging and manufacturing and operating temperature variations is reduced.

The digital sense amplifier can work with a wide range of dc currents because integration time is adaptable to the level of dc current. If the reference voltage Vref changes, the time for the capacitor voltage Vintg to reach the reference voltage Vref will also change.

Logic operations for the digital sense amplifier are implemented efficiently by the presettable counter. The single N-bit counter can perform operations such as counting, inverting, shifting and pre-setting. Consequently, silicon real estate is utilized more efficiently, whereby the digital sense amplifier can fit within a lower pitch of columns.

Figure 8:
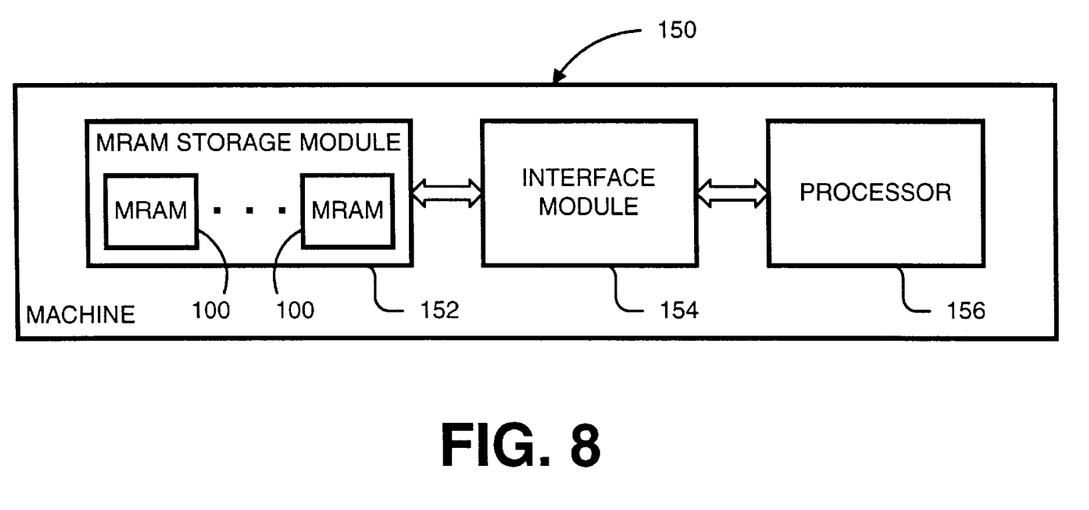
FIG. 8 is an illustration of a machine including one or more MRAM chips.

The MRAM device according to the present invention may be used in a wide variety of applications. FIG. 8 shows an exemplary general application for one or more MRAM chips 100. The general application is embodied by a machine 150 including an MRAM storage module 152, an interface module 154 and a processor 156. The MRAM storage module 152 includes one or more MRAM chips 100 for long term storage. The interface module 154 provides an interface between the processor 156 and the MRAM storage module 152. The machine 150 could also include fast volatile memory (e.g., SRAM) for short term storage.

For a machine 150 such as a notebook computer or personal computer, the MRAM storage module 152 might include a number of MRAM chips 100 and the interface module 154 might include an EIDE or SCSI interface. For a machine 150 such as a server, the MRAM storage module 152 might include a greater number of MRAM chips 100, and the interface module 154 might include a fiber channel or SCSI interface. Such MRAM storage modules 152 could replace or supplement conventional long term storage devices such as hard drives.

For a machine 150 such as a digital camera, the MRAM storage module 152 might include a smaller number of MRAM chips 100 and the interface module 154 might include a camera interface. Such an MRAM storage module 152 would allow long term storage of digital images on-board the digital camera.

The MRAM device according to the present invention offers many advantages over conventional long-term data storage devices such as hard drives. Accessing data from the MRAM devices is orders of magnitude faster than accessing data from conventional long-term storage devices such as hard drives. Additionally, MRAM devices are more compact than hard drives.

The invention is not limited to the specific embodiments described and illustrated above. For instance, the invention is not limited to the use of spin dependent tunneling devices. Other types of devices that could be used include, but are not limited to, giant magnetoresistance ("GMR") devices.

The invention has been described in connection with the rows being oriented along the easy axis. However, the rows and columns could be transposed.

Accordingly, the invention is not limited to the specific embodiments described and illustrated above. Instead, the invention is construed according to the claims that follow.

What is claimed is:

1. A method of sensing a resistance state of a selected memory cell in an MRAM device, the method comprising the steps of:
    using the selected memory cell and a supply voltage to charge an integrator;
    measuring an amount of time for a voltage on the integrator to reach a reference voltage; and
    comparing the amount of time to a threshold;
    whereby the selected memory cell is at a first resistance state if the amount of time is less than the threshold; and
    whereby the selected memory cell is at a second resistance state if the amount of time is greater than the threshold.

2. The method of claim 1, wherein the integrator is charged until a steady state current flows through the selected memory cell.

3. The method of claim 1, wherein the threshold is represented by a counter value; wherein the measured amount of time is also represented by a counter value; and wherein the comparison is performed by examining a sign bit of the difference between the threshold and measured amount of time, the sign bit indicating the resistance state of the memory cell.

4. The method of claim 3, wherein the amount of time is measured by a counter and a clock, the clock being used to increment the counter value at a clock frequency until a voltage on the integrator equals the reference voltage.

5. The method of claim 4, wherein the counter value indicating the threshold is stored in the counter; and wherein the counter value indicating the measured amount of time is added to the threshold by the counter.

6. The method of claim 1, further comprising the step of determining the threshold by using a reference cell and the reference voltage to charge the integrator; and measuring an amount of time for a voltage on the integrator to reach the reference voltage.

7. The method of claim 1, wherein the threshold is predetermined.

8. The method of claim 1, wherein the sensing includes a calibration cycle to determine the threshold followed by a sense cycle to determine the resistance state of the selected cell.

9. The method of claim 8, wherein the calibration and sense cycles are performed by the steps of:
    using the selected memory cell and the reference voltage to charge the integrator at least once;
    taking at least one first measurement of the amount of time for the voltage on the integrator to reach the reference voltage;
    writing at least one known logic state to the selected memory cell;
    using the selected memory cell and the reference voltage to charge the integrator;
    taking at least one second measurement of the amount of time for the voltage on the integrator to reach the reference voltage;
    comparing the first and second amounts of time to determine the resistance and, therefore, logic state of the selected memory cell; and
    writing back to the selected memory cell, if necessary.

10. The method of claim 9, wherein an estimated time amount and first and second measurements are summed together, and wherein a resulting sum is examined to determine the resistance state of the memory cell.

11. The method of claim 9, wherein 2n of reads of the selected memory cell are performed to obtain 2n first measurements, where integer n>0; wherein the selected memory cell is set to the first resistance state; wherein n reads of the selected memory cell are performed while the memory cell is at the first resistance state to obtain n second measurements; wherein the selected memory cell is set to the second resistance state; wherein another n reads of the selected memory cell are performed while the memory cell is at the second resistance state to obtain another n second measurements; and wherein the comparison is performed by forming a sum of the first and second measurements.

12. A circuit for sensing a resistance state of a memory cell in an MRAM device, the circuit comprising:
    an integrator; and
    a sense amplifier, coupled to the integrator and the memory cell, for measuring an amount of time for a voltage on the integrator to reach a reference voltage and for comparing the measured amount of time to a threshold;
    whereby the memory cell is at a first resistance state if the amount of time is less than the threshold; and
    whereby the memory cell is at a second resistance state if the amount of time is greater than the threshold.

13. The circuit of claim 12, wherein the sense amplifier includes a counter for storing a counter value; and a clock for causing the counter to increment the counter value at clock frequency until a voltage on the integrator equals a reference voltage, a most significant bit of the counter indicating whether the memory cell is at the first or second resistance state.

14. The circuit of claim 13, further comprising a preset register for storing contents of the counter and loading values into the counter, the preset register being integrated with the counter.

15. The circuit of claim 14, further comprising a controller for controlling the counter and preset register to perform a non-destructive read, the controller causing the counter to determine the threshold by causing a reference cell and a supply voltage to charge the integrator, and causing the counter to measure an amount of time for a voltage on the integrator to reach the reference voltage.

16. The circuit of claim 14, further comprising a controller for controlling the counter, the preset register and a write circuit to perform a destructive read, the controller:

causing the memory cell and the reference voltage to charge the integrator at least once;

causing the counter to take at least one first measurement of the amount of time for the voltage on the integrator to reach the reference voltage;

causing the write circuit to write at least one known logic state to the memory cell;

causing the memory cell and the reference voltage to charge the integrator;

causing the counter to take at least one second measurement of the amount of time for the voltage on the integrator to reach the reference voltage;

causing the preset register and the counter to compare the first and second amounts of time to determine the resistance and, therefore, logic state of the memory cell; and causing the write circuit to write back to the selected memory cell, if necessary.

17. The circuit of claim 13, wherein the counter includes:

a plurality of registers, each register including a T-type flip-flop, each flip-flop having a clock input and a Q output, one of the registers providing a least significant bit, another one of the registers providing a most significant bit;

the clock input of the flip-flop of the least significant bit being coupled to an output of the clock, the Q output of each flip-flop being coupled to the clock input of a next higher flip-flop, except for the most significant bit;

the Q output of the flip-flop of the most significant bit being coupled to an I/O pad.

18. The circuit of claim 17, wherein each register further includes a latch coupled to its flip-flop, an output of each latch providing a complement of the Q output of the associated flip-flop.

19. The circuit of claim 18, wherein each register further includes a circuit for inputting a pre-set value to its associated flip-flop, each circuit having a pre-set_in input; and wherein the pre-set_in input of the circuit of the most significant bit is coupled to a supply voltage VDD, the output of each latch being coupled to the pre-set_in input of the circuit of the next lower register, except for the least significant bit.

20. An MRAM device comprising:

an array of memory cells; and a read circuit for sensing resistance states of selected memory cells in the array, the read circuit including:

means for applying a potential to a selected memory cell and an equal potential to unselected memory cells in the array during a read operation;

means for integrating a current flowing through the selected memory cell during the read operation;

means for measuring an amount of time for a voltage on the integrating means to reach a reference voltage; and means for comparing the measured amount of time to a threshold, the comparing means indicating a first resistance state of the selected memory cell when the amount of time is less than the threshold, the comparing means indicating a second resistance state of the selected memory cell when the amount of time is greater than the threshold.

21. The device of claim 20, further comprising means for determining the threshold.

22. A presettable counter for a sense amplifier of a read circuit of an MRAM device, the sense amplifier including a clock, the MRAM device having an I/O pad, the counter comprising:

a plurality of registers, each register including a T-type flip-flop, each flip-flop having a clock input and a Q output, one of the registers providing a least significant bit, another one of the registers providing a most significant bit;

the clock input of flip-flop of the least significant bit being coupled to an output of the clock, the Q output of each flip-flop being coupled to the clock input of a next higher flip-flop, except for the most significant bit;

the Q output of the flip-flop of the most significant bit being coupled to the I/O pad.

23. The counter of claim 22, wherein each register further includes a latch coupled to its flip-flop, an output of each latch providing a complement of the Q output of the associated flip-flop.

24. The counter of claim 23, wherein each latch further includes a circuit for inputting a pre-set value to its associated flip-flop, each circuit having a pre-set_in input; and wherein the pre-set_in input of the circuit of the most significant bit is coupled to a supply voltage VDD, the output of each latch being coupled to the pre-set_in input of the circuit of the next lower register, except for the least significant bit.

* * * * *